(12) United States Patent
Fujiki et al.

(10) Patent No.: US 12,009,234 B2
(45) Date of Patent: Jun. 11, 2024

(54) CONTROL SYSTEM FOR SEMICONDUCTOR MANUFACTURING

(71) Applicant: EBARA CORPORATION, Tokyo (JP)

(72) Inventors: Masayuki Fujiki, Tokyo (JP); Nobuhito Kiyosawa, Tokyo (JP); Kei Kitamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/748,547

(22) Filed: Jan. 21, 2020

(65) Prior Publication Data

US 2020/0251361 A1 Aug. 6, 2020

(30) Foreign Application Priority Data

Feb. 1, 2019 (JP) ................................. 2019-017336

(51) Int. Cl.
*H01L 21/67* (2006.01)
*G05B 19/418* (2006.01)

(52) U.S. Cl.
CPC .. *H01L 21/67219* (2013.01); *G05B 19/41835* (2013.01); *G05B 2219/45031* (2013.01)

(58) Field of Classification Search
CPC ......... H01L 21/67219; H01L 21/67005; H01L 21/67155; H01L 21/67242; G05B 19/41835; G05B 2219/45031; G05B 19/05; G05B 19/418; G05B 19/04; G05B 23/02; Y02P 90/02; H04L 9/32
See application file for complete search history.

(56) References Cited

U.S. PATENT DOCUMENTS

| | | | | |
|---|---|---|---|---|
| 2004/0186610 A1* | 9/2004 | Harakawa | ........ | G05B 19/41865 700/121 |
| 2007/0139371 A1* | 6/2007 | Harsham | ................. | G06F 3/011 726/17 |
| 2011/0167352 A1* | 7/2011 | Ohgishi | ............... | H04N 21/422 715/733 |
| 2014/0121789 A1 | 5/2014 | Brandes et al. | | |

(Continued)

FOREIGN PATENT DOCUMENTS

| CN | 101529344 A | 9/2009 |
|---|---|---|
| CN | 104160379 A | 11/2014 |

(Continued)

*Primary Examiner* — Christopher E. Everett
*Assistant Examiner* — Tameem D Siddiquee
(74) *Attorney, Agent, or Firm* — BakerHostetler

(57) ABSTRACT

A control system which can efficiently perform an operational adjustment work and can safely adjust a unit is disclosed. The control system 20 includes a controller 10 and a plurality of terminal devices connectable to the controller 10. The controller 10 includes a storage device 110 storing a processing program, and a processor 120 for performing operations and calculations based on the processing program. The processing program including instructions to give an access operation right, which permits access by an adjustment target unit to an access target unit, to a target terminal device which is one of the terminal devices in response to a request for the access operation right, transmitted from the target terminal device to the controller 10, on the condition that an exclusive operation right for the access target unit has not been given to any of the terminal devices.

12 Claims, 11 Drawing Sheets

(56) References Cited

U.S. PATENT DOCUMENTS

| | | | | |
|---|---|---|---|---|
| 2014/0258380 A1* | 9/2014 | Urakawa | ................ | H04L 67/42 |
| | | | | 709/203 |
| 2015/0241866 A1* | 8/2015 | Takeda | ............... | G05B 19/4184 |
| | | | | 700/121 |
| 2019/0037624 A1* | 1/2019 | Tokuchi | ................ | H04W 12/77 |

FOREIGN PATENT DOCUMENTS

| | | |
|---|---|---|
| CN | 104423963 A | 3/2015 |
| CN | 105579202 A | 5/2016 |
| JP | 2003-272982 A | 9/2003 |
| JP | 2005-085784 A | 3/2005 |
| JP | 2009-210504 A | 9/2009 |
| JP | 2015-138786 A | 7/2015 |

\* cited by examiner

CONTROL SYSTEM FOR SEMICONDUCTOR MANUFACTURING

CROSS REFERENCE TO RELATED APPLICATION

This document claims priority to Japanese Patent Application Number 2019-017336 filed Feb. 1, 2019, the entire contents of which are hereby incorporated by reference.

BACKGROUND

A semiconductor manufacturing apparatus is a composite apparatus which can perform a sequence of processes, including polishing, cleaning and drying, for a substrate such as a wafer. Such a semiconductor manufacturing apparatus is composed of various units such as a processing unit(s) and a transport unit(s).

In an operational adjustment work in a semiconductor manufacturing apparatus, it is known to set an operation right for a unit of the semiconductor manufacturing apparatus on a terminal device in order to limit the authority to perform the operation of the unit to the terminal device (see Japanese Patent Laid-Open Publications Nos. 2005-85784 and 2015-138786). In such a semiconductor manufacturing apparatus, an operation right for two units, a processing unit and a transport unit, is set on one terminal device in performing adjustment of a substrate transport operation.

However, when one terminal device has an operation right for two units, a processing unit and a transport unit, another operator cannot perform an operational adjustment for the two units for a period of time longer than necessary. This may result in an inability to sufficiently increase the efficiency of an operational adjustment work for the semiconductor manufacturing apparatus.

If an operation right for a processing unit and an operation right for a transport unit are allocated to two terminal devices in order to increase the work efficiency, then there is a fear that while performing operational adjustment on the processing unit, the transport unit may perform an operation to transport a substrate to the processing unit. Thus, the possibility of the risk (problem) of collision of a transport arm, injury to a worker, etc. cannot be eliminated.

The above problems are not peculiar to a semiconductor manufacturing apparatus; such problems may also be encountered in other composite apparatuses including a plurality of units. For example, in a composite apparatus (e.g. a plating apparatus) including a liquid supply unit, and a substrate processing unit for processing a substrate by using a liquid fed from the liquid supply unit, there is a fear that the liquid supply unit may perform an operation to supply the liquid to the substrate processing unit with unexpected timing.

SUMMARY OF THE INVENTION

There is provided a control system which can efficiently perform an operational adjustment work and can safely adjust a unit.

There is provided a non-transitory computer-readable recording medium recording a program for a control system which can efficiently perform an operational adjustment work and can safely adjust a unit.

There is provided a method for a control system which can efficiently perform an operational adjustment work and can safely adjust a unit.

The below-described embodiments relate to a control system for controlling a plurality of units constituting a semiconductor manufacturing apparatus, to a recording medium recording a program for the control system, and to a method for the control system.

In an embodiment, there is provided a control system for controlling a plurality of units constituting a semiconductor manufacturing apparatus, the control system comprising: a controller; and a plurality of terminal devices connectable to the controller, wherein the controller has an interlock function which does not allow any two of the terminal devices to simultaneously operate any one of the units, wherein the units include an access target unit, and an adjustment target unit which is accessible to the access target unit, and wherein the controller includes a storage device storing a processing program, and a processor for performing operations and calculations based on the processing program, the processing program including instructions to give an access operation right, which permits access by the adjustment target unit to the access target unit, to a target terminal device which is one of the terminal devices in response to a request for the access operation right, transmitted from the target terminal device to the controller, on the condition that an exclusive operation right for the access target unit has not been given to any of the terminal devices.

In an embodiment, the processing program includes instructions to give the access operation right to the target terminal device on the condition that an exclusive operation right for the adjustment target unit has been given to the target terminal device.

In an embodiment, the units include a first adjustment target unit corresponding to said adjustment target unit, and a second adjustment target unit, and wherein the processing program includes instructions to give the access operation right to the target terminal device on the condition that there exists no other terminal device that has acquired an access operation right which permits access by the second adjustment target unit to the access target unit.

In an embodiment, each of the terminal devices includes an image generating section for generating a unit operation image to operate each of the units, and an image display for displaying the unit operation image, the unit operation image including an access operation right request icon which indicates whether to request the access operation right.

In an embodiment, the access operation right request icon is one of a button, a check box and a combo box, and wherein the image generating section includes a storage device storing an image display program, and a processor for performing operations and calculations based on the image display program, the image display program including instructions to switch the display of the access operation right request icon subject to the acquisition of the access operation right.

In an embodiment, the unit operation image includes an exclusive operation right request icon which indicates whether to request an exclusive operation right for the adjustment target unit, the exclusive operation right request icon being one of a button, a check box and a combo box, and wherein the image display program includes instructions to switch the display of the exclusive operation right request icon subject to the acquisition of the exclusive operation right.

In an embodiment, there is provided a non-transitory computer-readable recording medium recording a processing program for a control system for controlling a plurality of units constituting a semiconductor manufacturing apparatus, the processing program causing a computer to execute a process comprising: allowing a target terminal device, which is one of terminal devices provided in the control system, to request from the controller an access operation right that permits access by an adjustment target unit, which is one of the units, to an access target unit which is another one of the units; and giving the access operation right to the target terminal device on the condition that an exclusive operation right for the access target unit has not been given to any of the terminal devices.

In an embodiment, the processing program causes the computer to execute a process comprising giving the access operation right to the target terminal device on the condition that an exclusive operation right for the adjustment target unit has been given to the target terminal device.

In an embodiment, the processing program causes the computer to execute a process comprising giving the access operation right to the target terminal device on the condition that there exists no other terminal device that has acquired an access operation right which permits access by a second adjustment target unit, which differs from a first adjustment target unit corresponding to said adjustment target unit, to the access target unit.

In an embodiment, there is provided a method for a control system for controlling a plurality of units constituting a semiconductor manufacturing apparatus, the method comprising: allowing a target terminal device, which is one of terminal devices provided in the control system, to request from a controller an access operation right that permits access by an adjustment target unit, which is one of the units, to an access target unit which is another one of the units; and giving the access operation right to the target terminal device on the condition that an exclusive operation right for the access target unit has not been given to any of the terminal devices.

In an embodiment, the access operation right is given to the target terminal device on the condition that an exclusive operation right for the adjustment target unit has been given to the target terminal device.

In an embodiment, the access operation right is given to the target terminal device on the condition that there exists no other terminal device that has acquired an access operation right which permits access by a second adjustment target unit, which differs from a first adjustment target unit corresponding to said adjustment target unit, to the access target unit.

In an embodiment, there is provided a control system for controlling a plurality of units constituting a semiconductor manufacturing apparatus, the control system comprising: a controller; and a plurality of terminal devices connectable to the controller, wherein the controller has an interlock function which does not allow any two of the terminal devices to simultaneously operate any one of the units, wherein the units include an access target unit, and an adjustment target unit which is accessible to the access target unit, and wherein the controller is configured to give an access operation right, which permits access by the adjustment target unit to the access target unit, to a target terminal device which is one of the terminal devices in response to a request for the access operation right, transmitted from the target terminal device to the controller, on the condition that an exclusive operation right for the access target unit has not been given to any of the terminal devices.

In an embodiment, there is provided a control system for controlling a plurality of units constituting a semiconductor manufacturing apparatus, the control system comprising: a controller; and a plurality of terminal devices connectable to the controller, wherein the controller has an interlock function which does not allow any two of the terminal devices to simultaneously operate any one of the units, wherein the units include an access target unit, and an adjustment target unit which is accessible to the access target unit, and wherein the controller includes a storage device storing a processing program, and a processor for performing operations and calculations based on the processing program, the processing program causing a controller to execute an operation of including instructions to give an access operation right, which permits access by the adjustment target unit to the access target unit, to a target terminal device which is one of the terminal devices in response to a request for the access operation right, transmitted from the target terminal device to the controller, on the condition that an exclusive operation right for the access target unit has not been given to any of the terminal devices.

The control system gives an access operation right for an access target unit to a target terminal device on the condition that an exclusive operation right for the access target unit has not been given to any of the plurality of terminal devices. Therefore, the worker can efficiently and safely perform an operational adjustment work for the unit.

DESCRIPTION OF EMBODIMENTS

Embodiments will now be described with reference to the drawings.

Figure 1:
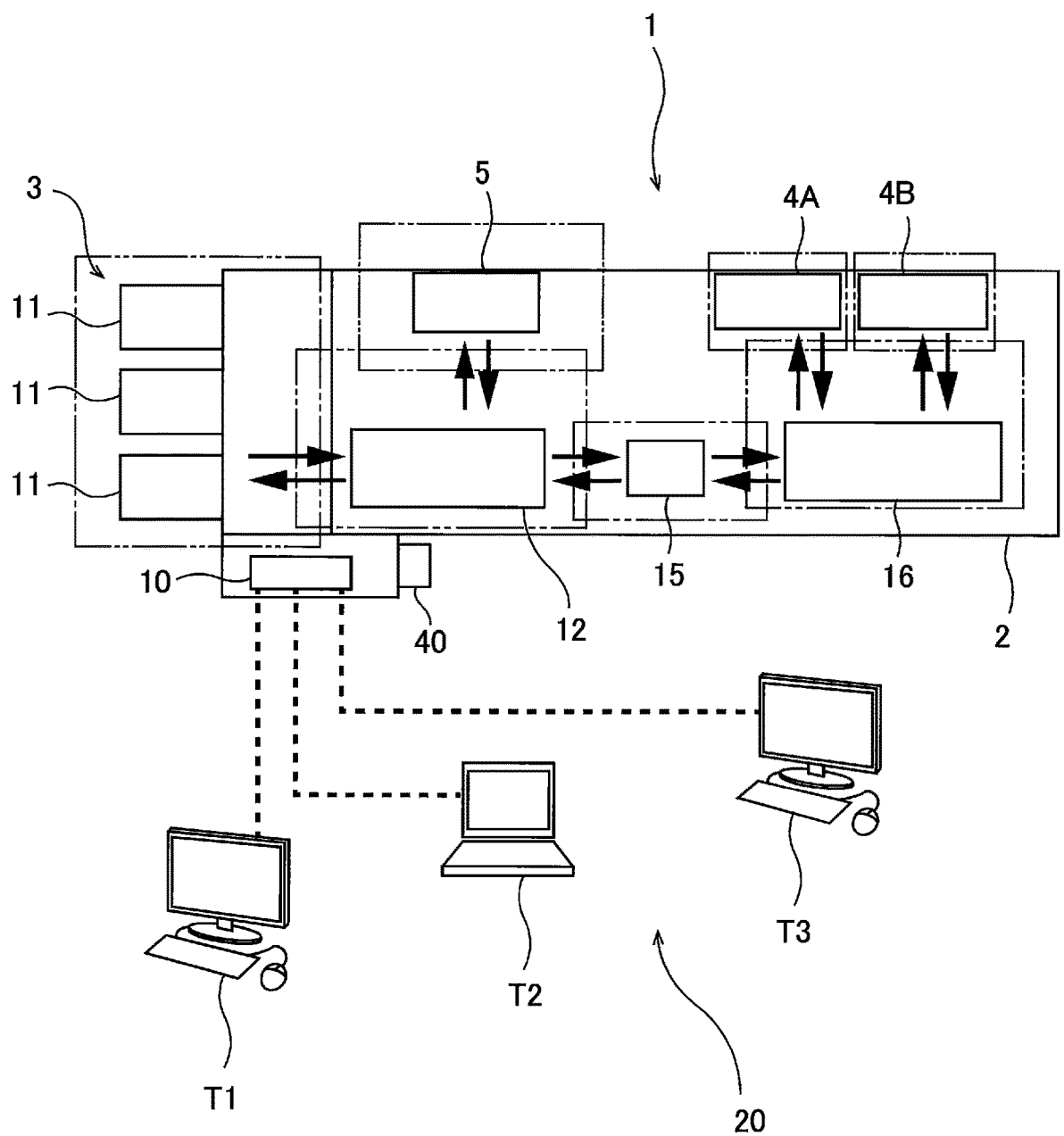
FIG. 1 is a schematic view showing an embodiment of a semiconductor manufacturing apparatus.

FIG. 1 is a schematic view showing an embodiment of a semiconductor manufacturing apparatus 1. A system (hereinafter sometimes referred to as the control system 20) which can efficiently and safely adjust the units of the semiconductor manufacturing apparatus 1 can be applied to the semiconductor manufacturing apparatus 1.

The control system 20 can be applied not only to the semiconductor manufacturing apparatus 1 but also to other apparatuses which each include a plurality of units. For example, the control system 20 can be applied to a plating apparatus which includes a plating unit(s) and a transport unit(s). In one embodiment, the plating apparatus may include a liquid supply unit, and a substrate processing unit for processing a substrate by using a liquid fed from the liquid supply unit. Details of the control system 20 will be described later.

As shown in FIG. 1, the semiconductor manufacturing apparatus 1 is a composite apparatus which can perform a sequence of process steps for polishing, cleaning and drying a substrate such as a wafer. The semiconductor manufacturing apparatus 1 includes a housing 2 whose interior is separated by partitions (not shown) into a loading/unloading unit 3, polishing units 4A, 4B, and a cleaning unit 5. The semiconductor manufacturing apparatus 1 includes a controller 10 for controlling the operations of the respective units (in this embodiment the loading/unloading unit 3, the polishing units 4A, 4B, and the cleaning unit 5). The controller 10 is disposed within the housing 2.

The loading/unloading unit 3 includes a plurality of loading ports 11 each for placing thereon a wafer cassette in which a large number of wafers (substrates) are housed. A first transport unit 12 is disposed adjacent to the loading/unloading unit 3. A stage 15 is disposed adjacent to the first transport unit 12. The first transport unit 12 can access the loading/unloading unit 3 and the stage 15 to transport a wafer thereto.

The polishing units 4A, 4B are units for chemomechanically polishing a wafer surface. The polishing units 4A, 4B have the same construction. Though not depicted, each of the polishing units 4A, 4B includes a polishing table, a top ring for holding a wafer and pressing the wafer against a polishing pad on the polishing table, and a polishing liquid supply nozzle for supplying a polishing liquid (slurry) to the polishing pad.

A second transport unit 16 is disposed adjacent to the polishing units 4A, 4B. The second transport unit 16 can access the stage 15 and the polishing units 4A, 4B to transport a wafer thereto.

The cleaning unit 5 is located adjacent to the polishing units 4A, 4B. The cleaning unit 5 is a unit for cleaning and drying a polished wafer. The first transport unit 12 can access the cleaning unit 5 to transport a wafer thereto.

A process flow for processing a wafer will now be described. The first transport unit 12 transports a wafer (unprocessed wafer), existing in the loading/unloading unit 3, to the stage 15. The second transport unit 16 transports the wafer on the stage 15 to either one of the polishing units 4A, 4B. The polishing unit which has received the wafer polishes a surface of the wafer. The polished wafer is transported again to the stage 15 by the second transport unit 16.

The first transport unit 12 transports the wafer on the stage 15 to the cleaning unit 5. The cleaning unit 5 cleans and dries the wafer. The dried wafer is transported by the first transport unit 12 to the loading/unloading unit 3. The polishing, cleaning and drying of the wafer are thus performed in this order.

Each of the loading/unloading unit 3, the polishing units 4A, 4B, the stage 15, and the cleaning unit 5 is referred to as a processing unit. The first transport unit 12 can access the loading/unloading unit 3, the cleaning unit 5 and the stage 15. The second transport unit 16 can access the stage 15 and the polishing units 4A, 4B. Thus, the transport units 12, 16 can respectively access the particular processing units. The operations of the transport units 12, 16 are controlled by the controller 10.

As shown in FIG. 1, the semiconductor manufacturing apparatus 1 includes the control system 20 which gives a terminal device an operation right to exclusively operate a unit. The control system 20 includes an exclusive system which enables a work to be performed efficiently while ensuring safety of the work. The control system 20 includes the controller 10, and a plurality of terminal devices T1, T2, T3 which selectively operate a plurality of units (in this embodiment the processing units and the transport units) through the controller 10.

The controller 10 is incorporated in the semiconductor manufacturing apparatus 1, and the terminal devices T1, T2, T3, in whole or in part, are disconnectably connected to the controller 10 of the semiconductor manufacturing apparatus 1. The controller 10 has an interlock function which does not allow any two of the terminal devices T1, T2, T3 to simultaneously operate any one of the units.

A "unit" means an assembly (stage, processing chamber, transport robot, etc.) of devices (sensor, motor, etc.) for performing an intention (recipe-based processing, transport of a wafer, etc.). In this embodiment, "unit" is a general term for the above-described processing units and the above-described transport units.

A smaller number of the terminal devices than the number of the units are provided in this embodiment. Each of the terminal devices T1, T2, T3 can operate any one of the units (in this embodiment the loading/unloading unit 3, the polishing unit 4A or 4B, the cleaning unit 5, the first transport unit 12, the second transport unit 16, or the stage 15). Though the three terminal devices are provided in this embodiment, the number of terminal devices is not limited to that of this embodiment.

A network (not shown) that connects the controller 10, the processing units 3, 4A, 4B, 5, 15, and the transport units 12, 16 is established in the semiconductor manufacturing apparatus 1. The terminal devices T1, T2, T3 are connectable to the network. Thus, the terminal devices T1, T2, T3 (and the controller 10) are connectable to the processing units and the transport units via the network. The terminal devices T1, T2, T3 may be exemplified by personal computers and mobile terminal devices.

In this embodiment the terminal devices T1, T2, T3 are connectable to one apparatus (namely the semiconductor manufacturing apparatus 1). An exclusive operation right is a right that permits exclusive operation of a unit. Thus, when a terminal device dynamically acquires an exclusive operation right for a unit which is a target for adjustment, the terminal device that has acquired the exclusive operation right can monopolize the operation of the adjustment target unit. The terminal device that has acquired the exclusive operation right can arbitrarily waive the exclusive operation right for the adjustment target unit.

Figure 2:
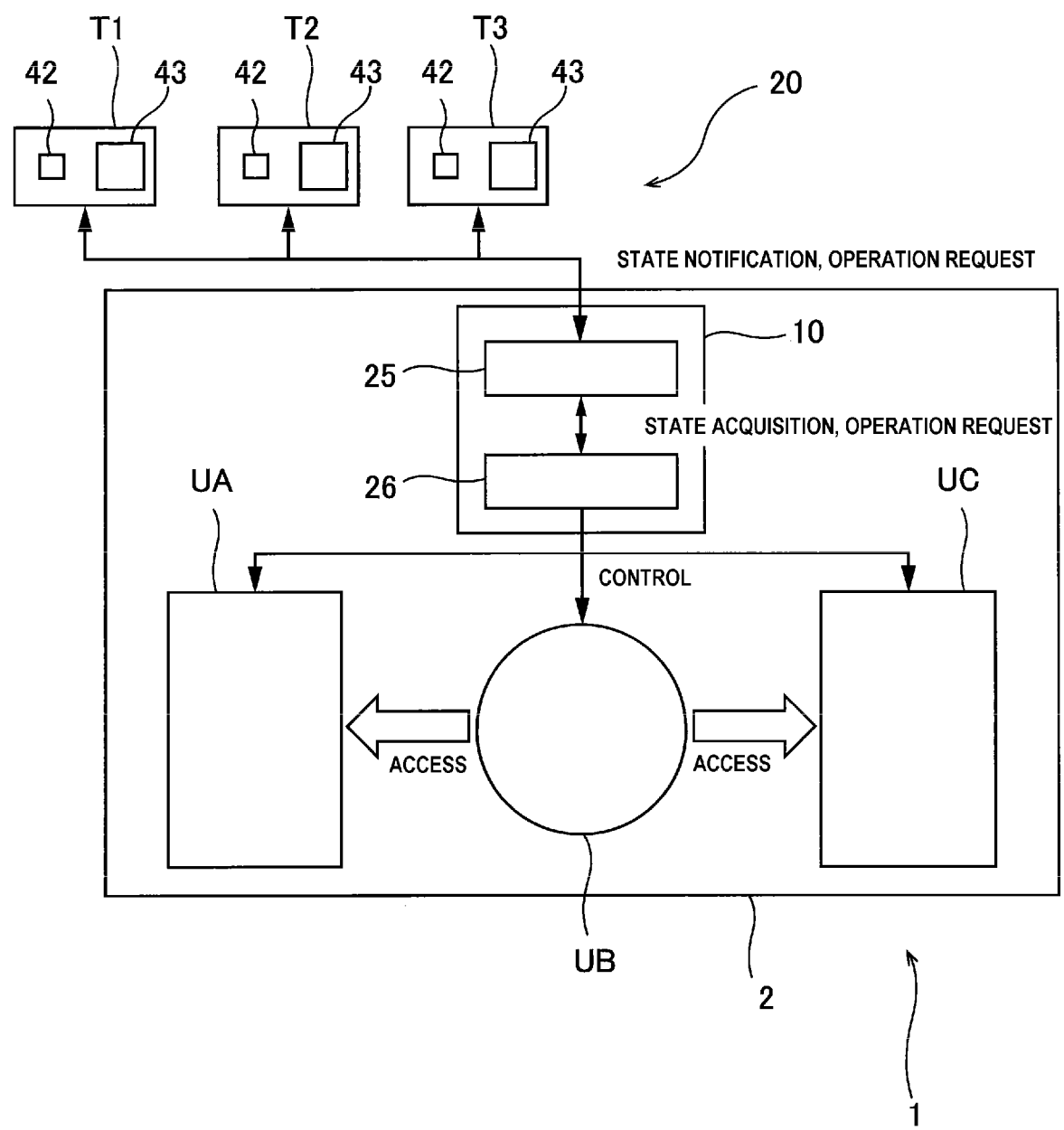
FIG. 2 is a diagram showing a construction of a control system.

FIG. 2 is a diagram showing the construction of the control system 20. For ease of explanation, FIG. 2 illustrates a case in which a unit UA, a unit UB and a unit UC are provided in the housing 2. In this embodiment, the units UA, UC are processing units, while the unit UB is a transport unit. The unit UB can access the unit UA and the unit UC.

In one embodiment, the unit UB may be a liquid supply unit, and the units UA, UC may be substrate processing units for processing a substrate by using a liquid fed from the liquid supply unit. The liquid supply unit (namely the unit UB) is configured to supply the liquid to the substrate processing units (namely the units UA, UC) through a liquid supply line (not shown). Also in this case, the unit UB can access the unit UA and the unit UC. As used herein, "access" refers to a movement of a unit which exerts a physical influence on a unit.

As shown in FIG. 2, the controller 10 includes a server device 25 connected to the terminal devices T1, T2, T3, and a sequencer (e.g. PLC) 26 for controlling the operations of the unit UA, the unit UB and the unit UC.

The server device 25 is a computer (personal computer) in which is installed a server processing program for performing data management of apparatus parameters, recipes, jobs, etc., issuance of a unit operation command to the sequencer 26 and/or notification of the state of a unit to each terminal device. The below-described mediation of an exclusive operation right for each unit (i.e. assignment of the exclusive operation right) is also performed by the server processing program.

Figure 3:
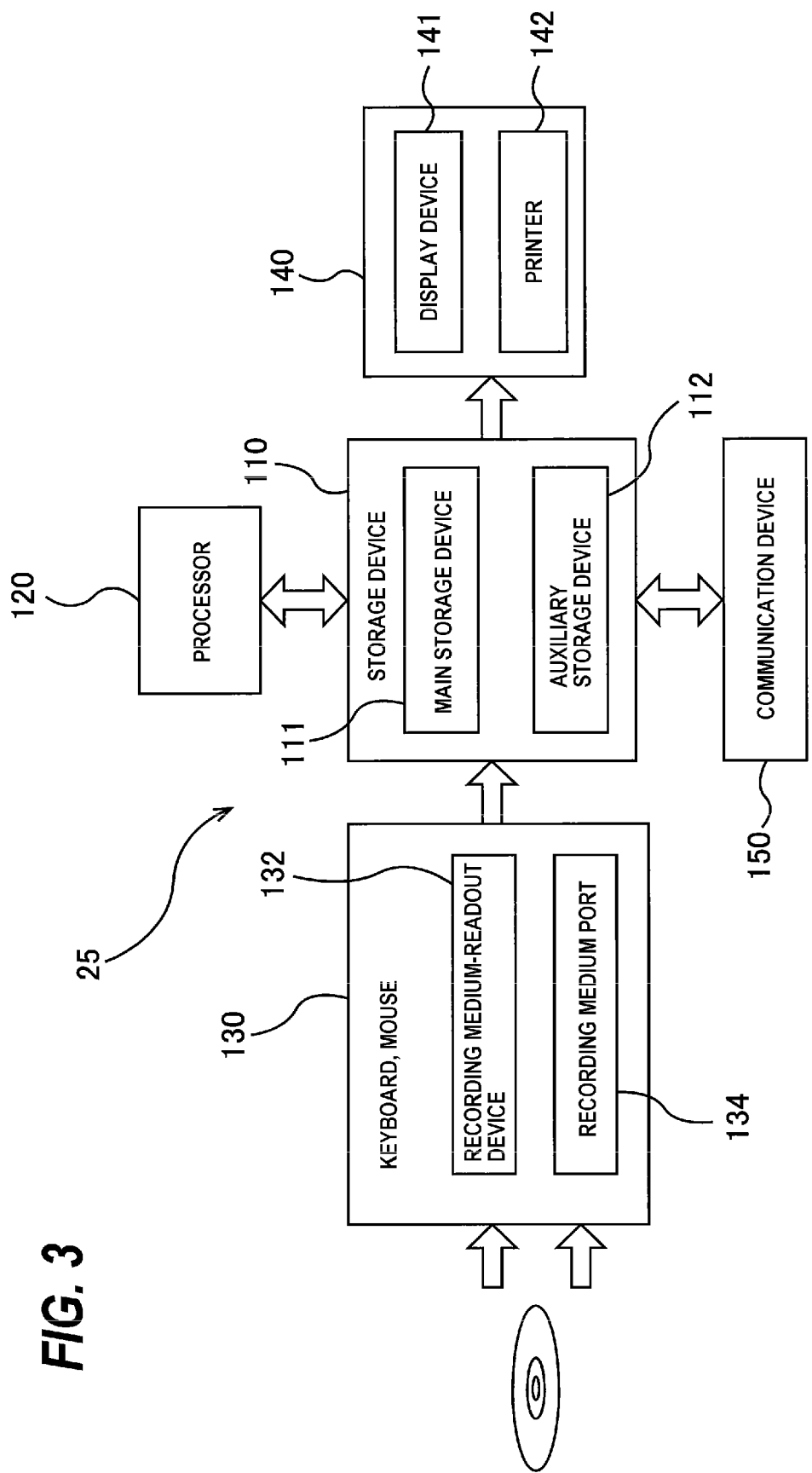
FIG. 3 is a diagram showing a construction of a server device.

In this embodiment the server device 25 is comprised of a computer. FIG. 3 is a diagram showing the construction of the server device 25. The server device 25 includes a storage device 110 for storing programs and data, a processor 120, such as a CPU (Central Processing Unit) or a GPU (Graphics Processing Unit), for performing operations and calculations based on the programs stored in the storage device 110, an input device 130 for inputting data, programs and informations into the storage device 110, an output device 140 for outputting processing results and processed data, and a communication device 150 for connection to a communication network such as the Internet or a local area network.

In one embodiment, the server device 25 may not include the input device 130 or the output device 140. In this case, each of the terminal devices T1, T2, T3 has the function of the input device 130 and the function of the output device 140.

The storage device 110 includes a main storage device 111 accessible by the processor 120, and an auxiliary storage device 112 for storing data and programs. The main storage device 111 is, for example, a random access memory (RAM). The auxiliary storage device 112 is, for example, a hard disk drive (HDD) or a solid state drive (SSD).

The input device 130 includes a keyboard and a mouse, and also includes a recording medium-readout device 132 for reading out data from a recording medium, and a recording medium port 134 to which the recording medium is to be connected. The recording medium is a computer-readable recording medium which is a non-transitory tangible material, such as an optical disk (e.g. CD-ROM or DVD-ROM) or a semiconductor memory (e.g. USB flash drive or memory card). The recording medium-readout device 132 may be exemplified by an optical drive such as a CD-ROM drive or a DVD-ROM drive, and a memory reader. The recording medium port 134 may be exemplified by a USB port. Programs and/or data, stored in the recording medium, are introduced into the server device 25 via the input device 130, and stored in the auxiliary storage device 112 of the storage device 110. The output device 140 includes a display device 141 and a printer 142.

Figure 4A:
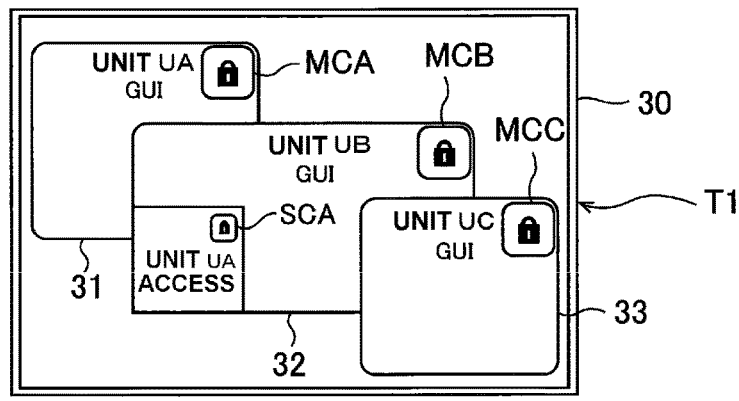
FIG. 4A is a diagram showing an operation screen of a terminal device.
Figure 4B:
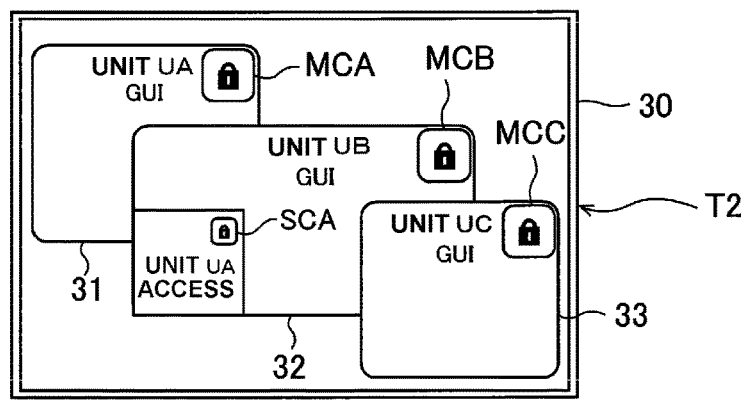
FIG. 4B is a diagram showing an operation screen of a terminal device.
Figure 4C:
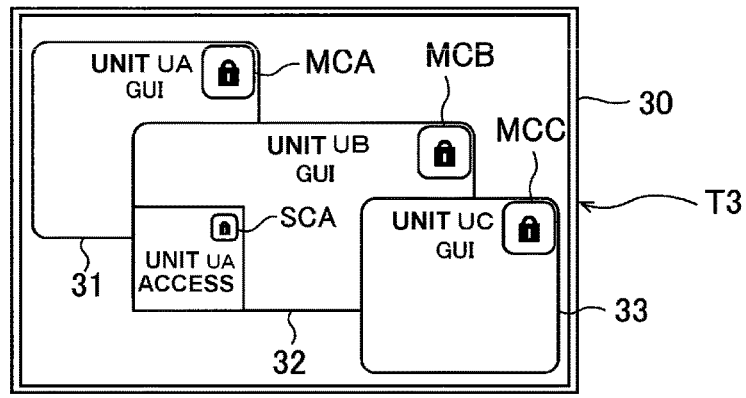
FIG. 4C is a diagram showing an operation screen of a terminal device.

FIG. 4A is a diagram showing an operation screen 30 of the terminal device T1, FIG. 4B is a diagram showing an operation screen 30 of the terminal device T2, and FIG. 4C is a diagram showing an operation screen 30 of the terminal device T3. As shown in FIGS. 4A through 4C, the operation screens 30 of the terminal devices T2, T3 display the same image as the operation screen 30 of the terminal device T1. Therefore, the following description illustrates the image displayed on the operation screen 30 of the terminal device T1.

The operation screen 30 of the terminal device T1 displays a unit operation image 31 for operating the unit UA, a unit operation image 32 for operating the unit UB, and a unit operation image 33 for operating the unit UC. The unit operation images 31, 32, 33 are user interfaces. In this embodiment the unit operation images 31, 32, 33 are graphical user interfaces (GUI).

A program (device control program) for controlling a device(s) provided in the semiconductor manufacturing apparatus 1 has been installed in each of the terminal devices T1, T2, T3. Further, in each of the terminal devices T1, T2, T3 has been installed an image display program that causes the terminal device to display, on its operation screen 30, main icons (exclusive operation right request icons) MCA, MCB, and MCC for acquiring an exclusive right for the unit UA, the unit UB and the unit UC, respectively. Therefore, the terminal devices T1, T2, T3 display the main icons MCA, MCB, MCC on their respective operation screens 30.

The same programs as the device control program and the image display program have been installed in the controller 10. As shown in FIG. 1, the semiconductor manufacturing apparatus 1 includes a display device 40 connected to the controller 10. The worker may operate each of the unit UA, the unit UB and the unit UC through the display device 40.

In this embodiment the main icon MCA is displayed in part of the unit operation image 31, the main icon MCB is displayed in part of the unit operation image 32, and the main icon MCC is displayed in part of the unit operation image 33.

In the embodiment shown in FIGS. 4A through 4C, each of the main icons MCA, MCB, MCC is a button with a key mark. The main icons MCA, MCB, MCC may each have an identifier for identification among the icons. The identifier may be exemplified by a numerical number, bit information or a character string, predefined for each unit. The use of such an identifier can enhance maintenance and safety of each unit.

Figure 5:
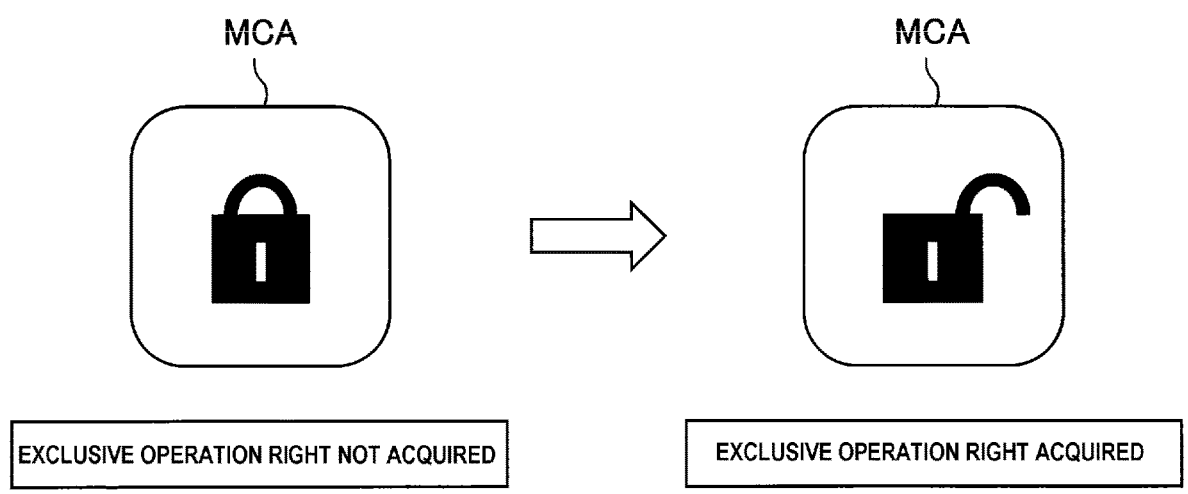
FIG. 5 is a diagram showing switching of a display of a main icon.

FIG. 5 is a diagram showing switching of the display of the main icon MCA. The switching images of the main icon MCA are the same as those of the main icons MCB, MCC. Therefore, depiction of the switching images of the main icons MCB, MCC have been omitted from FIG. 5.

As shown in FIG. 5, each of the terminal devices T1, T2, T3 switches the display of the selected main icon MCA subject to the acquisition of an exclusive operation right for the adjustment target unit. Upon the acquisition of an exclusive operation right for the adjustment target unit, the main icon MCA is switched from a "locked" image to an "unlocked" image.

Each of the terminal devices T1, T2, T3 includes an image generating section 42 for generating a unit operation image to operate each of the unit UA, the unit UB and the unit UC, and an image display 43 for displaying an image generated by the image generating section 42 (see FIG. 2). The main icons MCA, MCB, MCC and the below-described sub-icons SCA, SCC are displayed on the operation screen 30 of the image display 43. Though not depicted, the display device 40 also includes an image generating section for generating a unit operation image to operate each of the unit UA, the unit UB and the unit UC, and an image display for displaying an image generated by the image generating section.

The image generating section 42 includes a storage device (corresponding to the above-described storage device 110) storing the above-described image display program, and a processor (corresponding to the above-described processor 120) for performing operations and calculations based on the image display program. The image generating section 42 switches the display of the main icon MCA subject to the acquisition of an exclusive operation right for the adjustment target unit.

Figure 6:
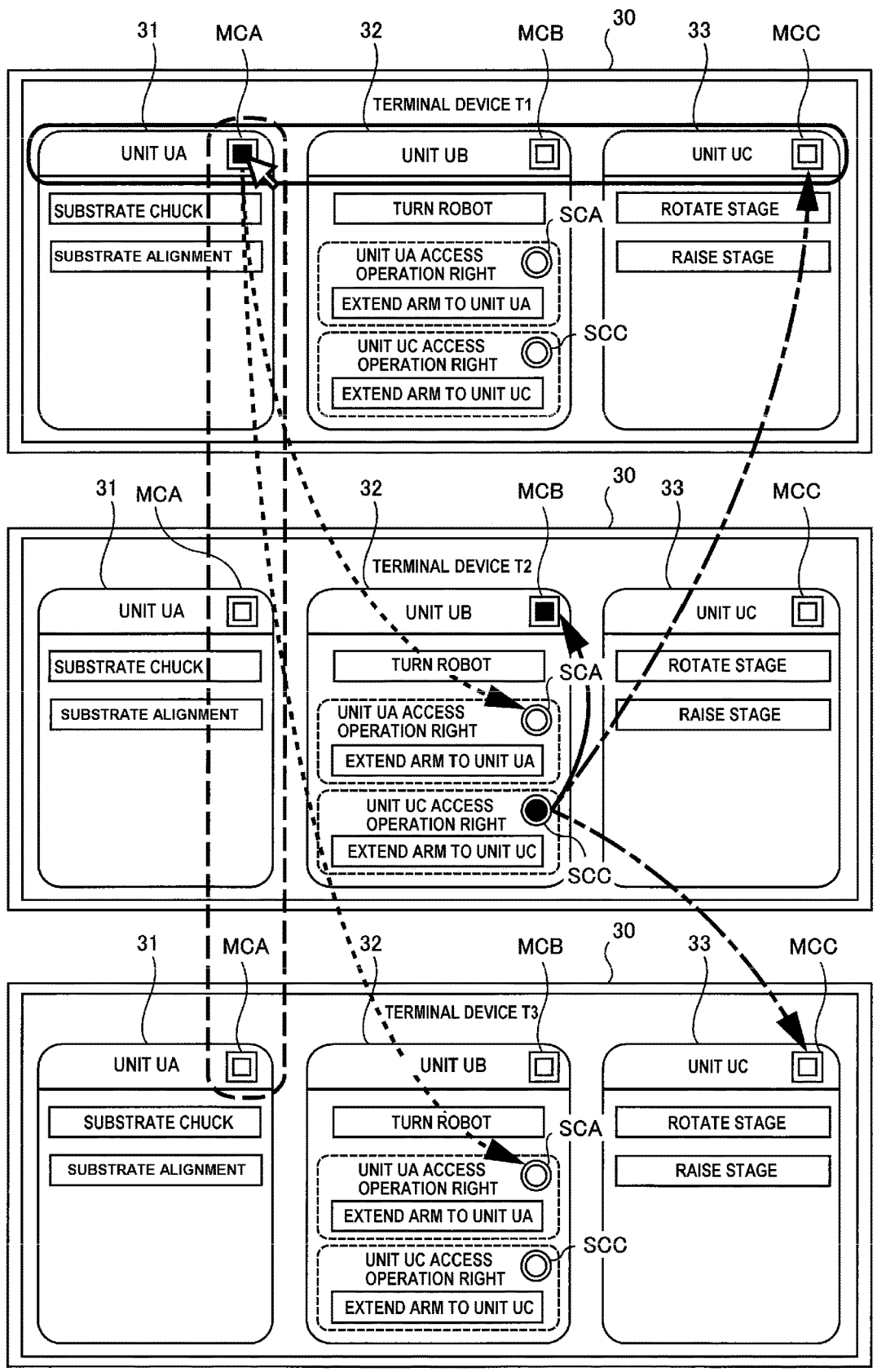
FIG. 6 is a diagram showing another embodiment of unit operation images.

FIG. 6 is a diagram showing another embodiment of the unit operation images 31, 32, 33. As shown in FIG. 6, each of the main icons MCA, MCB, MCC may be a check box or a combo box. Each of the main icons MCA, MCB, MCC is thus displayed in a visible state on the operation screen 30. Therefore, the worker can easily perceive at a glance the acquisition of an exclusive operation right.

Figure 7:
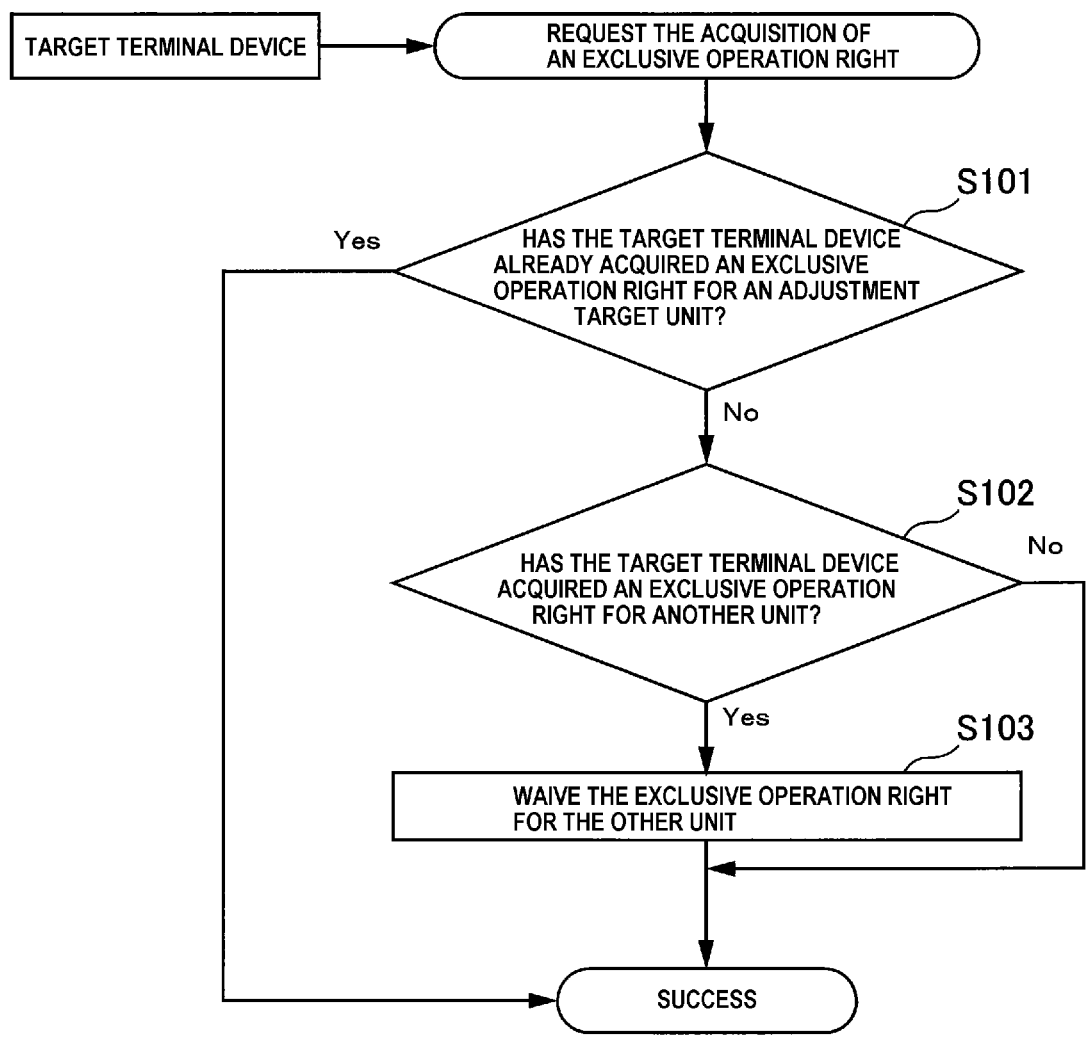
FIG. 7 is a diagram showing an embodiment of a processing flow executed by a controller when a target terminal device acquires an exclusive operation right for an adjustment target unit.

FIG. 7 is a diagram showing an embodiment of a processing flow executed by the controller 10 when a target terminal device acquires an exclusive operation right for an adjustment target unit. As shown in FIG. 7, a terminal device (target terminal device) which is targeted among the terminal devices T1, T2, T3 requests the controller 10 (more specifically the server device 25) to allow it to acquire an exclusive operation right for an adjustment target unit corresponding to a main icon selected from the main icons MCA, MCB, MCC displayed on the operation screen 30. More specifically, a request signal is transmitted from the target terminal device to the controller 10.

The controller 10 (more specifically the server device 25) operates based on a program electrically stored in the storage device 110. The controller 10, upon receipt of the request (request signal) from the target terminal device, determines whether the target terminal device has already acquired an exclusive operation right for the adjustment target unit (see step S101). If the target terminal device has acquired an exclusive operation right for the adjustment target unit (see "Yes" in step S101), then the controller 10 determines the success of the acquisition of an exclusive operation right for the adjustment target unit, and transmits an enabling signal to the target terminal device. In this manner, the controller 10 terminates the processing.

If the target terminal device has not acquired an exclusive operation right for the adjustment target unit (see "No" in step S101), then the controller 10 determines whether the target terminal device has acquired an exclusive operation right for a unit other than the adjustment target unit (see step S102). If the target terminal device has not acquired an exclusive operation right for any other unit (see "No" in step S102), then the controller 10 determines the success of the acquisition of an exclusive operation right for the adjustment target unit.

If the target terminal device has acquired an exclusive operation right for another target unit (see "Yes" in step S102), then the controller 10 waives the previously-acquired exclusive operation right for the other target unit (see step S103), and determines the success of the acquisition of an exclusive operation right for the adjustment target unit.

The controller 10 thus allows the target terminal device, which is requesting the acquisition of an exclusive operation right for the adjustment target unit, to acquire the exclusive operation right on the condition that the target terminal device has not acquired an exclusive operation right for any of the units, or that a previously-acquired exclusive operation right is waived. According to this embodiment, a target terminal device can dynamically acquire an exclusive operation right for a target unit.

As shown in FIGS. 4A through 4C and FIG. 6, a plurality of unit operation images are displayed on the operation screen 30. Images to be displayed on the operation screen 30 are not limited to unit operation images; in some cases, an apparatus parameter image and a recipe setting image may also be displayed on the operation screen 30. There is a fear that when the worker intends to perform an operation of a particular unit, with such plural images being displayed on the operation screen 30, the worker can accidentally perform an operation of another unit due to an image selection operation error. According to this embodiment, a target terminal device acquires an exclusive operation right for one target unit. Therefore, even if the worker makes an image selection operation error, the error will not cause the problem of accidentally performing an operation of another unit.

A program for causing the server device 25 to perform the above-described steps is stored in a computer-readable recording medium which is a non-transitory tangible material, and is provided to the server device 25 via the recording medium. Alternatively, the program may be provided to the server device 25 via a communication network such as the Internet or a local area network.

The acquisition of an exclusive operation right for an adjustment target unit will now be described with reference to FIG. 6. When the worker selects the main icon MCA (e.g. by clicking on it with a mouse) of the unit operation image 31 in the terminal device T1, the terminal device T1 requests an exclusive operation right for the unit UA from the controller 10.

Referring to FIG. 6, the terminal device T1 has not acquired an exclusive operation right for any of the units UA, UB, UC. Therefore, the controller 10 allows the terminal device T1 to acquire an exclusive operation right for the unit UA. Upon the acquisition by the terminal device T1 of the exclusive operation right for the unit UA, the controller 10 switches the display of the main icon MCA in the unit operation image 31 of the terminal device T1.

Figure 8:
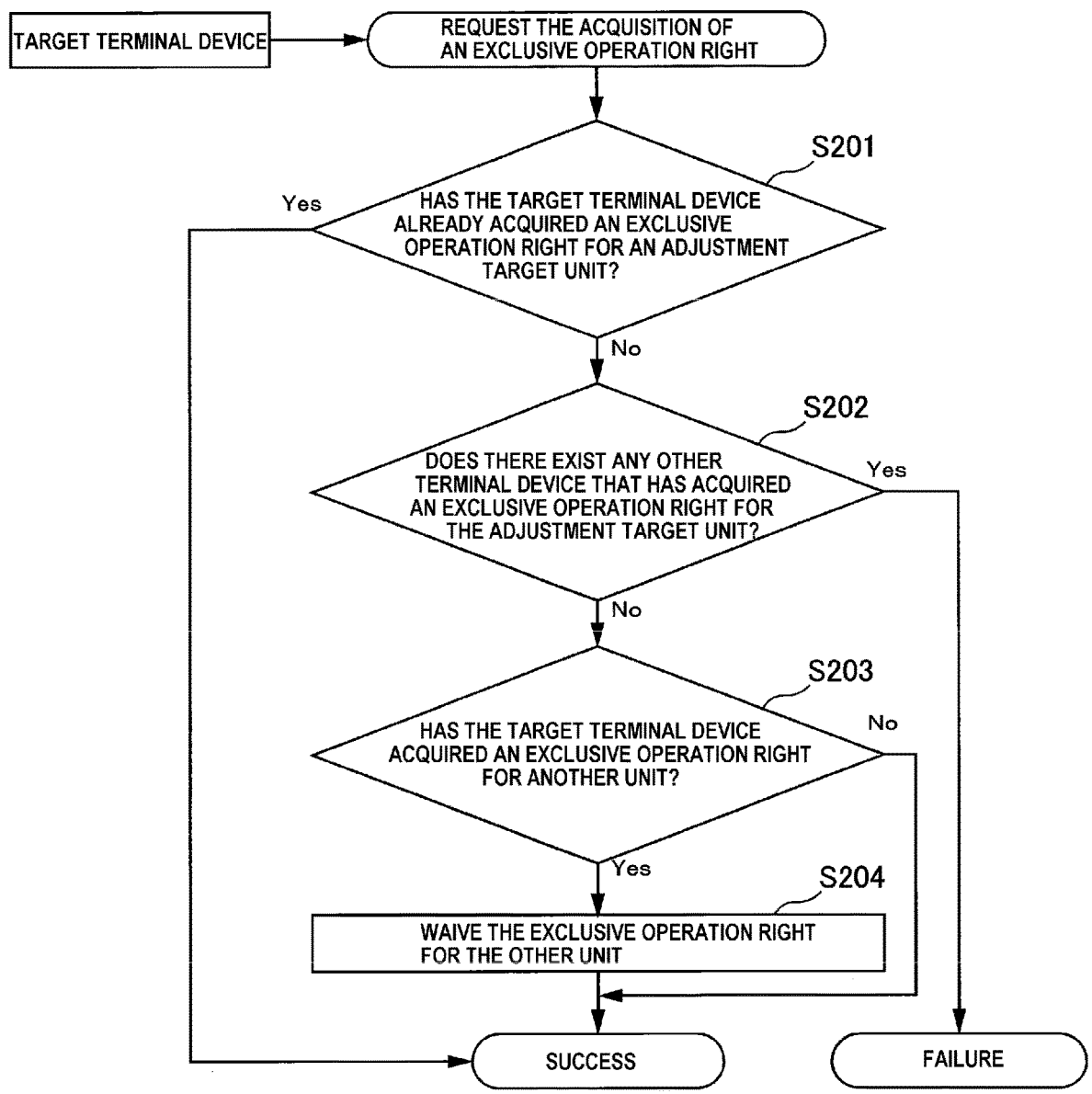
FIG. 8 is a diagram showing another embodiment of a processing flow executed by the controller when the target terminal device acquires the exclusive operation right for the adjustment target unit.

FIG. 8 is a diagram showing another embodiment of a processing flow executed by the controller 10 when a target terminal device acquires an exclusive operation right for an adjustment target unit. The controller 10 may permit the acquisition of an exclusive operation right for an adjustment target unit by performing the steps shown in FIG. 8.

As shown in FIG. 8, the controller 10 performs the same step as the step S101 of FIG. 7 (see step S201) and, if a target terminal device has acquired an exclusive operation right for an adjustment target unit (see "Yes" in step S201), then the controller 10 determines the success of the acquisition of an exclusive operation right for the adjustment target unit.

If the target terminal device has not acquired an exclusive operation right for the adjustment target unit (see "No" in step S201), then the controller 10 determines whether there exists any other terminal device that has acquired an exclusive operation right for the adjustment target unit (see step S202). If there exists another terminal device that has acquired an exclusive operation right for the adjustment target unit (see "Yes" in step S202), then the controller 10 determines the failure of the acquisition of an exclusive operation right for the adjustment target unit. In this manner, the controller 10 terminates the processing.

If there exists no other terminal device that has acquired an exclusive operation right for the adjustment target unit (see "No" in step S202), then the controller 10 performs the same steps as the steps S102 and S103 of FIG. 7 (see steps S203 and S204) and determines the success of the acquisition of an exclusive operation right for the adjustment target unit.

The number of units for which a terminal device can acquire an exclusive operation right is one. In other words, one terminal device can acquire an exclusive operation right for only one unit. Thus, referring to the embodiment illustrated in FIG. 6, when the terminal device T1 acquires an exclusive operation right for the unit UA, the terminal device T1 cannot acquire an exclusive operation right for the unit UB or the unit UC (see the area bounded by the solid line in FIG. 6).

Only one terminal device can exclusively operate a unit. Thus, the control system 20 can prevent a plurality of terminal devices from simultaneously operating one unit. Thus, referring to the embodiment illustrated in FIG. 6, when the terminal device T1 intends to acquire an exclusive operation right for the unit UA, the terminal device T1 can acquire the exclusive operation right on the condition that both of the other terminal devices T2 and T3 have not acquired an exclusive operation right for the unit UA (see the area bounded by the broken line in FIG. 6).

Figure 9:
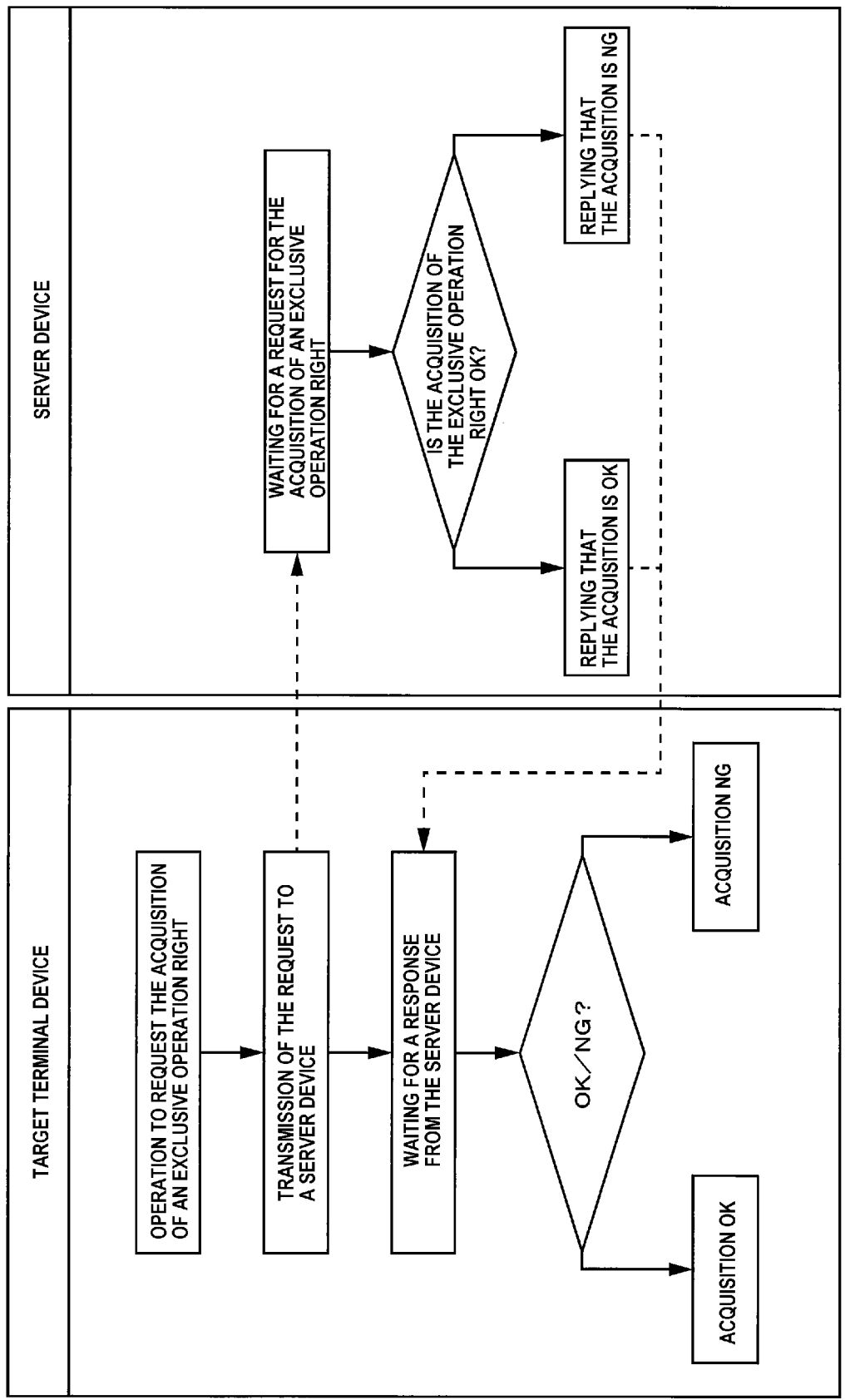
FIG. 9 is a diagram illustrating communication between a terminal device and the server device.

FIG. 9 is a diagram illustrating communication between a terminal device and the server device 25. As shown in FIG. 9, when the worker operates a target terminal device to request the acquisition of an exclusive operation right for an adjustment target unit, the target terminal device transmits to the server device 25 a request (request signal) to acquire the exclusive operation right. Upon receipt of the request for the acquisition of the exclusive operation right, the server device 25 determines whether the acquisition of the exclusive operation right is possible. If the acquisition of the exclusive operation right is permissible, the server device 25 transmits a signal (enabling signal) indicating that to the terminal device. If the acquisition of the exclusive operation right is not permissible, the server device 25 transmits a signal (disabling signal) indicating that to the terminal device. The terminal device acquires the exclusive operation right on receipt of the enabling signal, and does not acquire the exclusive operation right on receipt of the disabling signal.

In one embodiment, a target terminal device which could not acquire an exclusive operation right for an adjustment target unit can execute, through the controller 10, a request for the acquisition of the exclusive operation right to another terminal device which has acquired an exclusive operation right for the adjustment target unit. Upon the request for the acquisition of the exclusive operation right, the controller 10 asks the other terminal device, which has acquired the exclusive operation right for the adjustment target unit, whether to permit the acquisition of the exclusive operation right by the target terminal device. If the other terminal device permits the acquisition of the exclusive operation right by the target terminal device, then the target terminal device acquires the exclusive operation right for the adjustment target unit. If the other terminal device does not permit the acquisition of the exclusive operation right by the target terminal device, then the target terminal device does not acquire the exclusive operation right for the adjustment target unit.

When the terminal device T1 has acquired an exclusive operation right for the unit UA, the terminal device T2 has acquired an exclusive operation right for the unit UB and the terminal device T3 has acquired an exclusive operation right for the unit UC, the following problem could arise. If the unit UB is a transport unit, the unit UB can access both the unit UA and the unit UC. Therefore, when the worker causes the unit UB to access the unit UA (or the unit UC) with the terminal device T2 during operational adjustment of the unit, a substrate transport hand of a transport robot of the unit UB, for example, can collide with a substrate processing stage of the unit UA (or the unit UC). Alternatively, the worker who is working at the unit UA (or the unit UC) can face a danger.

In view of this, the control system 20 has a construction to acquire an access operation right for an adjustment target unit. In particular, each of the terminal devices T1, T2, T3 displays on the operation screen 30 a sub-icon (access operation right request icon) SCA for acquiring an access operation right for the unit UB to access the unit UA, and a sub-icon (access operation right request icon) SCC for acquiring an access operation right for the unit UB to access the unit UC (see FIGS. 4A through 4C and FIG. 6). In this embodiment the sub-icons SCA, SCC are displayed in part of the unit operation image 32. In FIGS. 4A through 4C, the sub-icon SCC is hidden behind the unit operation image 33.

Each of the sub-icons SCA, SCC may be a button, a check box or a combo box. Each of the sub-icons SCA, SCC may be displayed in the same form as or in a different form from each of the main icons MCA, MCB, MCC.

An access operation right is a right that permits access by the transport unit to another unit (processing unit). Thus, when a terminal device has acquired an access operation right for an access target unit, the other terminal devices cannot acquire an exclusive operation right for the access target unit. In other words, when another terminal device has acquired an exclusive operation right for the access target unit, the target terminal device cannot acquire an access operation right for the transport unit to access the access target unit.

Owing to the above construction, a terminal device which has acquired an access operation right allows the transport unit to safely access the processing unit. A terminal device which has acquired an access operation right can arbitrarily waive the access operation right. The communication between a terminal device and the server device 25 as performed when the terminal device acquires an access operation right is the same as that of the embodiment shown in FIG. 9, and therefore a detailed description thereof is omitted.

Figure 10:
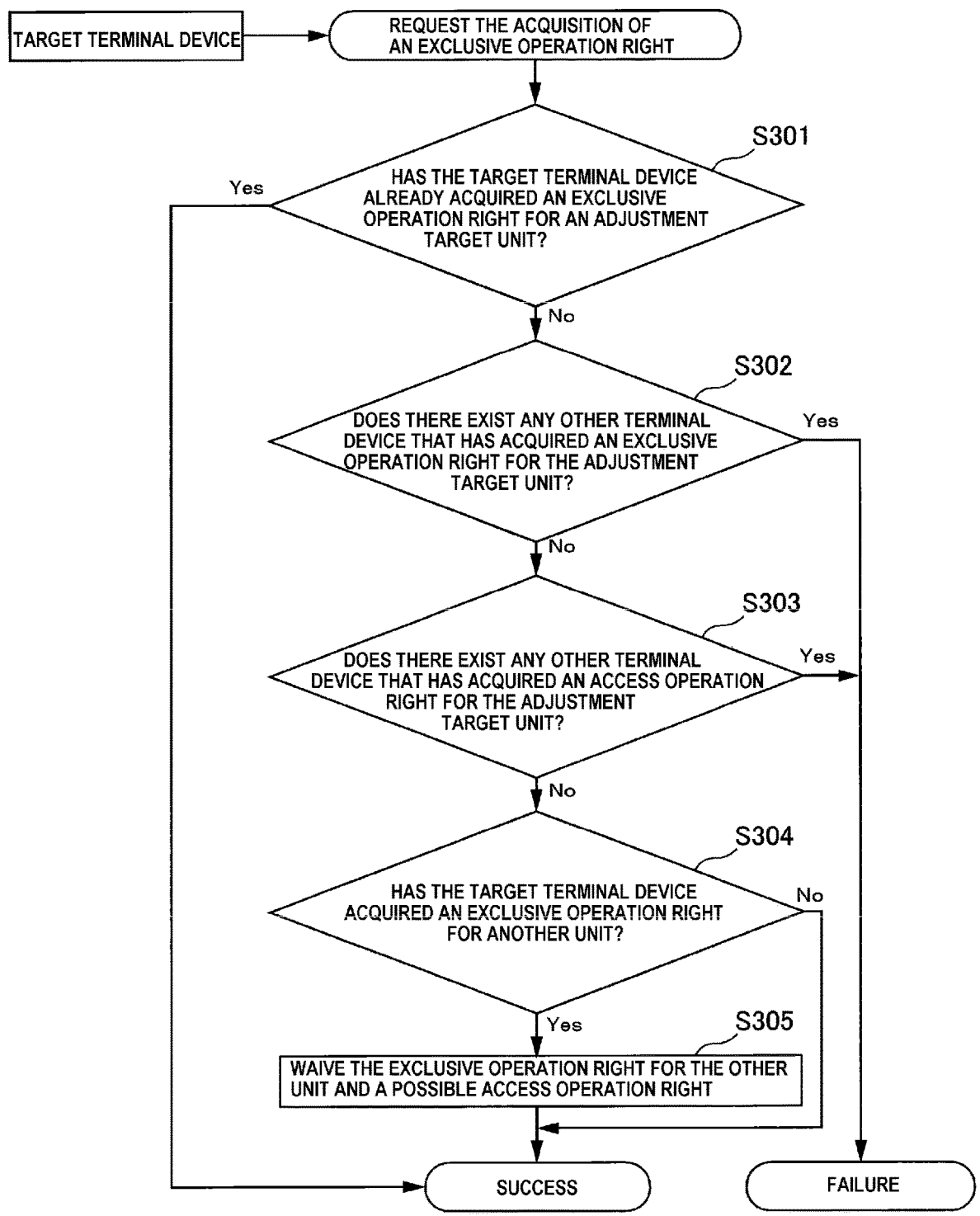
FIG. 10 is a diagram showing yet another embodiment of a processing flow executed by the controller when the target terminal device acquires the exclusive operation right for the adjustment target unit.

FIG. 10 is a diagram showing yet another embodiment of a processing flow executed by the controller 10 when a target terminal device acquires an exclusive operation right for an adjustment target unit. The controller 10 may permit the acquisition of an exclusive operation right for an adjustment target unit by performing the steps shown in FIG. 10.

As shown in FIG. 10, the controller 10 performs the same step as the step S101 of FIG. 7 (see step S301) and, if a target terminal device has acquired an exclusive operation right for an adjustment target unit (see "Yes" in step S301), then the controller 10 determines the success of the acquisition of an exclusive operation right for the adjustment target unit.

If the target terminal device has not acquired an exclusive operation right for the adjustment target unit (see "No" in step S301), then the controller 10 performs the same step as the step S202 of FIG. 8 (see step S302) and, if there exists another terminal device which has acquired an exclusive operation right for the adjustment target unit (see "Yes" in step S302), then the controller 10 determines the failure of the acquisition of an exclusive operation right for the adjustment target unit.

If there exists no other terminal device that has acquired an exclusive operation right for the adjustment target unit (see "No" in step S302), then the controller 10 determines whether there exists any other terminal device that has acquired an access operation right for the adjustment target unit (see step S303). Typically, when the adjustment target unit is an access target unit which is accessible by a transport unit, the controller 10 determines whether another terminal device, which has acquired an exclusive operation right for the transport unit, has acquired an access operation right for the access target unit. If there exists another terminal device which has acquired an access operation right for the adjustment target unit (see "Yes" in step S303), then the controller 10 determines the failure of the acquisition of an exclusive operation right for the adjustment target unit.

If there exists no other terminal device that has acquired an access operation right for the adjustment target unit (see "No" in step S303), then the controller 10 determines whether the target terminal device has acquired an exclusive operation right for another unit (see step S304). If the target terminal device has not acquired an exclusive operation right for any other unit (see "No" in step S304), then the controller 10 determines the success of the acquisition of an exclusive operation right for the adjustment target unit.

If the target terminal device has acquired an exclusive operation right for another target unit (see "Yes" in step S304), then the controller 10 waives the previously-acquired exclusive operation right for the other target unit (see step S305), and determines the success of the acquisition of an exclusive operation right for the adjustment target unit.

If the target terminal device has already acquired an access operation right belonging to another unit, then the controller 10 waives the previously-acquired access operation right, and determines the success of the acquisition of an exclusive operation right for the adjustment target unit (see step S305).

As will be appreciated from the above, in order for a target terminal device to acquire an exclusive operation right for an adjustment target unit, it is necessary that there exist no other terminal device that has acquired an access operation right for the adjustment target unit. Thus, referring to the embodiment illustrated in FIG. 6, in order for the terminal device T1 to acquire an exclusive operation right for the unit UA, it is necessary that none of the terminal devices T2, T3 have acquired an access operation right which permits access by the unit UB to the unit UA (see the dotted-line arrows in FIG. 6). Referring to the embodiment illustrated in FIG. 1, when the cleaning unit 5 is an adjustment target unit, a target terminal device cannot acquire an exclusive operation right for the cleaning unit 5 if any other terminal device has acquired an access operation right that permits access by the first transport unit 12 to the cleaning unit 5.

Figure 11:
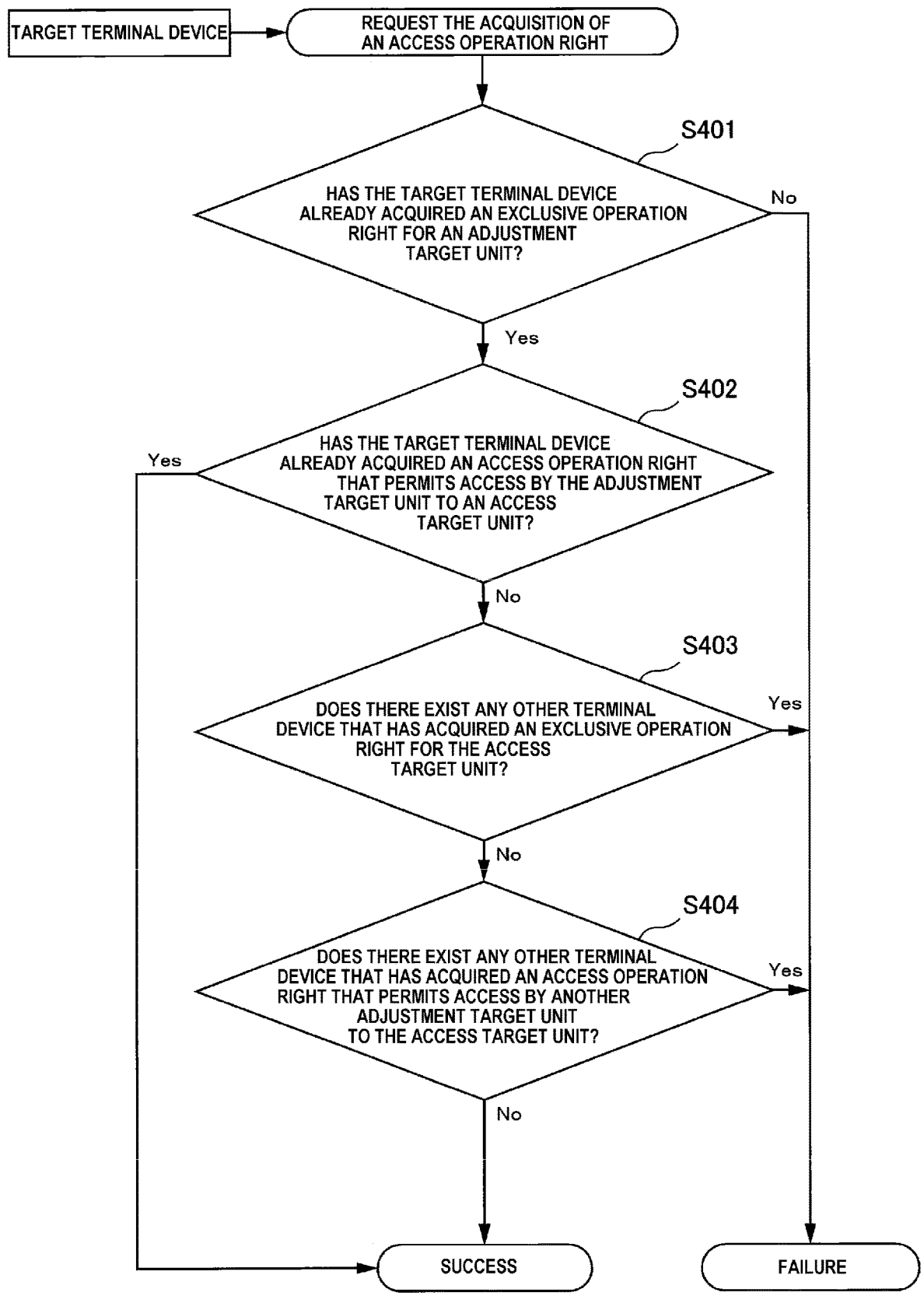
FIG. 11 is a diagram showing an embodiment of a processing flow executed by the controller when the target terminal device acquires an access operation right.

FIG. 11 is a diagram showing an embodiment of a processing flow executed by the controller 10 when a target terminal device acquires an access operation right. The controller 10, by performing the steps shown in FIG. 11, allows a target terminal device to acquire an access operation right that permits access by an adjustment target unit to an access target unit.

As shown in FIG. 11, a target terminal device requests the controller 10 to allow it to acquire an access operation right that permits access by an adjustment target unit (i.e. a transport unit as a target for adjustment) to a unit as a target for access (access target unit), corresponding to at least one sub-icon selected from the sub-icons SCA, SCC displayed on the operation screen 30. A transport unit as a target for adjustment will sometimes referred to herein as a target transport unit.

Referring to the embodiment illustrated in FIGS. 4A through 4C or the embodiment illustrated in FIG. 6, when the worker selects the sub-icon SCA or SCC (e.g. by clicking on it with a mouse) of the unit operation image 32 in a target terminal device, the target terminal device requests an access operation right for the selected access target unit from the controller 10.

The controller 10, upon receipt of the request from the target terminal device, determines whether the target terminal device has already acquired an exclusive operation right for the adjustment target unit (see step S401). If the target terminal device cannot acquire an exclusive operation right for the adjustment target unit (see "No" in step S401), then the controller 10 determines the failure of the acquisition of the access operation right. In this case, as a precondition for the acquisition of the access operation right, the controller 10 automatically executes the processing flow shown in FIG. 8 or the processing flow shown in FIG. 10 to allow the target terminal device to acquire an exclusive operation right for the adjustment target unit. Alternatively, in order to acquire an exclusive operation right for the adjustment target unit, the worker selects the main icon corresponding to the adjustment target unit, and causes the controller 10 to execute the processing flow shown in FIG. 8 or the processing flow shown in FIG. 10.

Upon the acquisition by the target terminal device of an exclusive operation right for the adjustment target unit (see "Yes" in step S401), the controller 10 determines whether the target terminal device has acquired an access operation right that permits access by the adjustment target unit to the access target unit (see step S402). If the target terminal device has acquired the access operation right (see "Yes" in step S402), then the controller 10 determines the success of the acquisition of the access operation right.

If the target terminal device has not acquired the access operation right (see "No" in step S402), then the controller 10 determines whether there exists any other terminal device that has acquired an exclusive operation right for the access target unit (see step S403). If there exists another terminal device that has acquired the exclusive operation right (see "Yes" in step S403), then the controller 10 determines the failure of the acquisition of the access operation right.

If there exists no other terminal device that has acquired the exclusive operation right (see "No" in step S403), then the controller 10 determines whether there exists any other terminal device that has acquired an access operation right that permits access by another adjustment target unit to the access target unit (see step S404). If there exists another terminal device which has acquired such access operation right, then the controller 10 determines the failure of the acquisition of the access operation right (see "Yes" in step S404).

If there exists no other terminal device that has acquired such access operation right (see "No" in step S404), then the controller 10 determines the success of the acquisition of the access operation right.

A processing flow for acquiring the above access operation right will now be described with reference to FIG. 1. Assume a case where the transport unit 12 is an adjustment target unit, the stage 15 is an access target unit, and there exists a terminal device which has acquired an exclusive operation right for the transport unit 16. In this case, if the terminal device, which has acquired an exclusive operation right for the transport unit 16, has also acquired an access operation right for the stage 15, then a target terminal device cannot acquire an access operation right that permits access by the transport unit 12 to the stage 15. This avoids a problem (e.g. collision) that could be encountered when a worker adjusting the transport unit 12 and a worker adjusting the transport unit 16 simultaneously perform access operations for the respective transport units to access the stage 15.

In order to acquire an access operation right that permits access by an adjustment target unit (i.e. a target transport unit) to an access target unit, it is necessary that there exist no terminal device that has acquired an exclusive operation right for the access target unit. Thus, referring to the embodiment illustrated in FIG. 6, if the terminal device T1 or the terminal device T3 has acquired an exclusive operation right for the unit UC, then the terminal device T2 cannot acquire an access operation right that permits access by the unit UB to the unit UC (see the chain-line arrows in FIG. 6). In other words, if the terminal device T2 has acquired an access operation right that permits access by the unit UB to the unit UC, then the controller 10 does not allow the terminal device T1 or the terminal device T3 to acquire an exclusive operation right for the unit UC even when the terminal device T1 or the terminal device T3 requests the acquisition of the exclusive operation right from the controller 10.

In order to acquire an access operation right, it is necessary to acquire an exclusive operation right for a transport unit to which the access operation right belongs (i.e. a target transport unit). Thus, referring to the embodiment illustrated in FIG. 6, when the terminal device T2 intends to acquire an access operation right that permits access by the unit UB to the unit UC, the controller 10 executes the processing flow shown in FIG. 11 and the processing flow shown in FIG. 8 (or FIG. 10) and, upon the success of the acquisition of an exclusive operation right for the unit UB, the terminal device T2 acquires the access operation right that permits access by the unit UB to the unit UC (see the solid-line arrow in FIG. 6).

A target terminal device may acquire a plurality of access operation rights. In the embodiment illustrated in FIG. 6, the terminal device T1 has acquired an exclusive operation right for the unit UA, and therefore the terminal device T2 cannot acquire an access operation right that permits access by the unit UB to the unit UA. If the terminal device T1 has not acquired an exclusive operation right for the unit UA, the terminal device T2 can acquire not only an access operation right that permits access by the unit UB to the unit UC but also an access operation right that permits access by the unit UB to the unit UA.

A target terminal device switches the display of a selected sub-icon subject to the acquisition of an access operation right. Thus, the image generating section 42 (see FIG. 2) switches the display of a sub-icon subject to the acquisition of an access operation right. Upon the acquisition of an access operation right, the sub-icon is switched from a "locked" image to an "unlocked" image (see FIG. 5).

The foregoing description is presented to enable a person of ordinary skill in the art to make and use the invention. Various modifications to the embodiments described above will be readily apparent to those of ordinary skill in the art and the technical concept of the present invention may be applied to other embodiments. Accordingly, the present invention is not intended to be limited to the embodiments illustrated but is to be accorded the widest scope consistent with the technical concept defined by the appended claims.

What is claimed is:

1. A control system for controlling a plurality of units constituting a semiconductor manufacturing apparatus, the control system comprising:
   a controller; and
   a plurality of terminal devices connectable to the controller, the plurality of terminal devices comprising a target terminal device;
   wherein the controller is configured to prevent any two of the plurality of terminal devices from simultaneously operating any one of the plurality of units,
   wherein the plurality of units comprise an access target unit and a transport unit, and
   wherein the controller comprises a storage device storing instructions executable by a processor, the instructions upon execution by the processor configure the processor to:
      process a request from the target terminal device to acquire an access operation right to the access target unit;
   give an access operation right to the transport unit to access the access target unit without the need to give the target terminal device exclusive operation rights to the access target unit, and
      permitting access by the transport unit to the access target unit, in response to receiving from the target terminal device the request for the access operation right, the permitting access being based on the condition that an exclusive operation right for the access target unit has not been given to any other of the plurality of terminal devices.

2. The control system according to claim 1, wherein the instructions upon execution by the processor are further configured to give the access operation right to the target terminal device on the condition that an exclusive operation right for the transport unit has been given to the target terminal device.

3. The control system according to claim 1, wherein the units include a first adjustment target unit corresponding to said transport unit, and a second adjustment target unit, and wherein the instructions upon execution by the processor are further configured to give the access operation right to the target terminal device on the condition that no other terminal device has acquired an access operation right which permits access by the second adjustment target unit to the access target unit.

4. The control system according to claim 1, wherein each of the plurality of terminal devices includes an image generating section for generating a unit operation image to operate each of the units, and an image display for displaying the unit operation image, the unit operation image including an access operation right request icon which indicates whether to request the access operation right.

5. The control system according to claim 4, wherein the access operation right request icon is one of a button, a check box and a combo box, and wherein the image generating section includes a second storage device storing an image display instructions, and a second processor, the image display instructions upon execution by the second processor switch the display of the access operation right request icon subject to the acquisition of the access operation right.

6. The control system according to claim 5, wherein the unit operation image includes an exclusive operation right request icon which indicates whether to request an exclusive operation right for the adjustment target unit, the exclusive operation right request icon being one of a button, a check box and a combo box, and wherein the image display instructions upon execution by the second processor switch the display of the exclusive operation right request icon subject to the acquisition of the exclusive operation right.

7. A non-transitory computer-readable storage medium storing instructions for a control system for controlling a plurality of units constituting a semiconductor manufacturing apparatus, the instruction upon execution by a processor, at least cause the operations comprising:
   receiving from a target terminal device among a plurality of terminal devices provided in the control system, a request to a controller to give the target terminal device an access operation right, the access operation right permitting access by a transport unit, a unit among the plurality of units, to an access target unit, another unit among the plurality of units; and giving the access operation right to the target terminal device after determining that an exclusive operation right for the access target unit has not been given to any other terminal device among the plurality of terminal devices, without giving the target terminal device exclusive operation rights for the access target unit; and permitting access by the transport unit to the access target unit, in response to receiving from the target terminal device the request for the access operation right, the permitting access being based on the condition that an exclusive operation right for the access target unit has not been given to any other of the plurality of terminal devices.

8. The storage medium according to claim 7, wherein the instruction upon execution by the processor further cause the operations comprising: giving the access operation right to the target terminal device after determining that an exclusive operation right for the transport unit has previously been given to the target terminal device.

9. The storage medium according to claim 7, wherein the instruction upon execution by the processor further cause the operations comprising: giving the access operation right to the target terminal device after determining that no other terminal device among the plurality of terminal devices has acquired an access operation right permitting access by a second adjustment target unit, different from a first adjustment target unit corresponding to said transport unit, to the access target unit.

10. A method for a control system for controlling a plurality of units constituting a semiconductor manufacturing apparatus, the method comprising:

receiving from a target terminal device among a plurality of terminal devices provided in the control system, a request to a controller to give the target terminal device an access operation right, the access operation right permitting access by a transport unit, a unit among the plurality of units, to an access target unit, another unit among the plurality of units; and giving the access operation right to the target terminal device after determining that an exclusive operation right for the access target unit has not been given to any other terminal device among the plurality of terminal devices, without giving the target terminal device exclusive operation rights to the access target unit; and permitting access by the transport unit to the access target unit, in response to receiving from the target terminal device the request for the access operation right, the permitting access being based on the condition that an exclusive operation right for the access target unit has not been given to any other of the plurality of terminal devices.

11. The method according to claim 10, wherein the access operation right is given to the target terminal device on the condition that an exclusive operation right for the transport unit has been given to the target terminal device.

12. The method according to claim 10, wherein the access operation right is given to the target terminal device on the condition that no other terminal device has acquired an access operation right which permits access by a second adjustment target unit, different from a first adjustment target unit corresponding to said transport unit, to the access target unit.

* * * * *